United States Patent [19]

Kryzaniwsky

[11] Patent Number: 5,280,192
[45] Date of Patent: * Jan. 18, 1994

[54] THREE-DIMENSIONAL MEMORY CARD STRUCTURE WITH INTERNAL DIRECT CHIP ATTACHMENT

[75] Inventor: Bohdan R. Kryzaniwsky, Hopewell Junction, N.Y.

[73] Assignee: International Business Machines Corporation, Armonk, N.Y.

[*] Notice: The portion of the term of this patent subsequent to Mar. 24, 2009 has been disclaimed.

[21] Appl. No.: 827,255

[22] Filed: Jan. 29, 1992

Related U.S. Application Data

[63] Continuation-in-part of Ser. No. 793,778, Nov. 18, 1991, which is a continuation of Ser. No. 516,504, Apr. 30, 1990, Pat. No. 5,099,309.

[51] Int. Cl.⁵ .................. H01L 23/16; H01L 23/02; H01L 23/12
[52] U.S. Cl. .................. 257/723; 257/724; 257/706; 257/720; 257/691
[58] Field of Search ............... 257/723, 724, 725, 720, 257/714, 713, 686, 922, 679, 691, 706, 786, 698

[56] References Cited

U.S. PATENT DOCUMENTS

| | | | |
|---|---|---|---|
| 4,447,716 | 5/1984 | Aigo | 235/492 |
| 4,640,866 | 2/1987 | Suzuki | 428/422 |
| 4,688,648 | 8/1987 | Sorel | 361/394 |
| 4,719,140 | 1/1988 | Hara | 428/138 |
| 4,727,246 | 2/1988 | Hara | 235/488 |
| 4,729,061 | 3/1988 | Brown | 361/386 |
| 4,733,061 | 3/1988 | Hegi | 235/492 |
| 4,763,188 | 8/1988 | Johnson | 257/777 |
| 4,773,955 | 9/1988 | Mabuchi | 156/257 |
| 4,862,249 | 8/1989 | Carlson | 257/686 |
| 4,889,980 | 12/1989 | Hara | 235/488 |
| 4,894,706 | 1/1990 | Sato et al. | 257/686 |
| 4,956,694 | 9/1990 | Eide . | |
| 4,962,415 | 10/1990 | Yamamoto et al. | 357/74 |
| 4,980,802 | 12/1990 | Champagne et al. | 361/401 |
| 4,985,601 | 1/1990 | Hagner | 174/261 |
| 4,990,759 | 2/1991 | Gloton et al. | 235/492 |
| 4,994,659 | 2/1991 | Yabe et al. | 235/492 |
| 5,016,085 | 5/1991 | Hubbard et al. | 357/74 |
| 5,099,309 | 3/1992 | Kryzaniwsky | 353/75 |

*Primary Examiner*—Sheila V. Clark
*Attorney, Agent, or Firm*—Richard Lau

[57] ABSTRACT

A card structure has an internal three dimensional array of implanted semiconductor chips. The card structure includes a power core and a plurality of chip cores. Each chip core is joined to the power core on opposite surfaces of the power core, and each chip core includes a compensator core having a two dimensional array of chip wells. Each chip well allows for a respective one of the semiconductor chips to be implanted therein. Further, a compliant dielectric material is disposed on the major surfaces of the compensator core except at the bottoms of the chip wells. The compliant dielectric material has a low dielectric constant and has a thermal coefficient of expansion compatible with those of the semiconductor chips and the compensator core, so that thermal expansion stability with the chips and the compensator core is maintained.

10 Claims, 9 Drawing Sheets

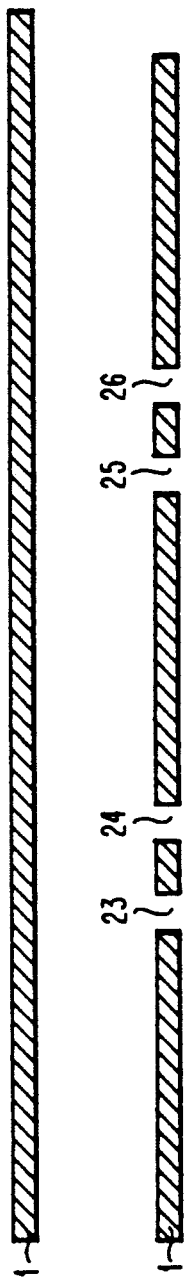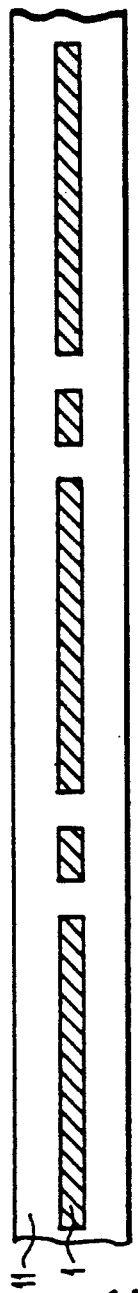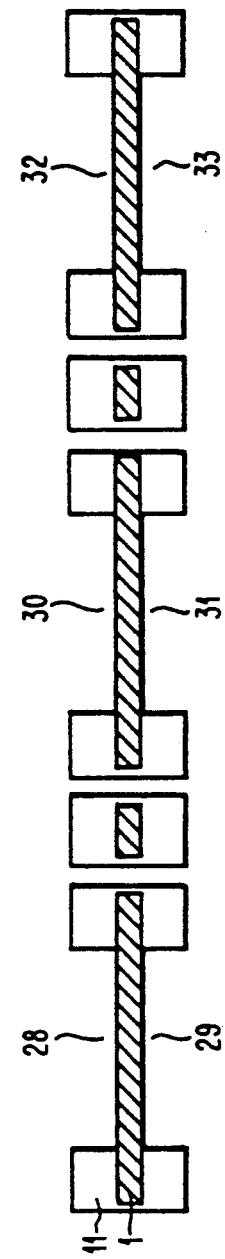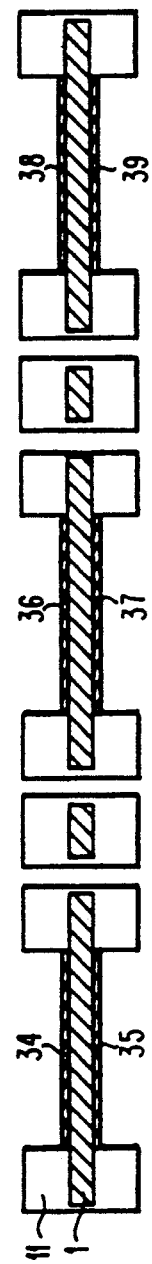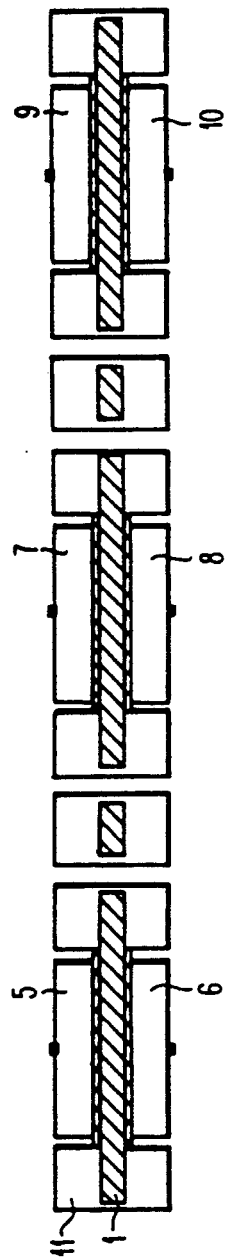
FIG. 1A  FIG. 1B  FIG. 1C  FIG. 1D  FIG. 1E  FIG. 1F

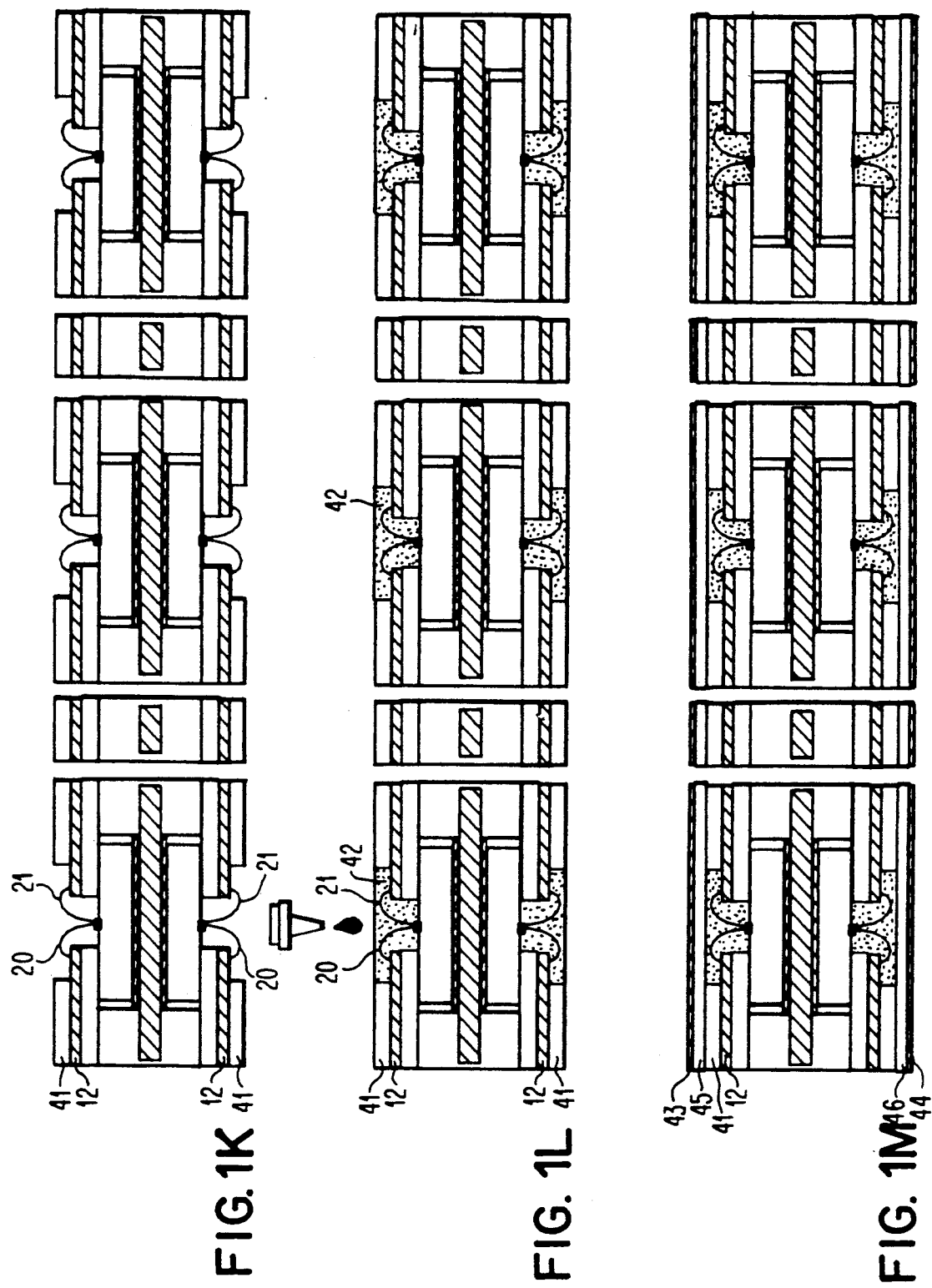

THREE-DIMENSIONAL MEMORY CARD STRUCTURE WITH INTERNAL DIRECT CHIP ATTACHMENT

RELATED U.S. APPLICATIONS

This is a continuation-in-part application of copending application Ser. No. 07/793,778, filed Nov. 18, 1991, which is a continuation application of application Ser. No. 07/516,504, filed Apr. 30, 1990 and issued as U.S. Pat. No. 5,099,309.

BACKGROUND OF THE INVENTION

1. Field of the Invention

The present invention generally relates to high density, high speed transistor memory chip packaging and more particularly, to a card structure containing within itself a three dimensional configuration of memory chips.

2. Description of the Related Art

High speed signal transmission between computer system components is becoming increasingly important as machine cycle times are pushed toward ever shorter values. Excessive lead lengths between circuit units introduces high lead inductance which impacts data transmission speed. In the case of conventional semiconductor memory packaging, for example, memory chips are placed in memory modules which, in turn, are mounted on memory cards. Such three-level packaging introduces signal path length delays which are likely to become unacceptable in upcoming high speed machines. To take full advantage of the high speed signals generated at the chip level, the chip input-output (I/O) pad to card structure signal line distance must be made as short as possible.

In U.S. Pat. No. 4,849,284, issued on Jul. 18, 1989 to David J. Arthur et al. for Electric Substrate Material, a ceramic filled fluoropolymer-based electrical substrate material is proposed for forming printed wiring boards for surface-mounted integrated circuit chips. The substrate material is said to enable board characteristics including low signal propagation delay. Increased chip density at the board level is not addressed, however.

U.S. Pat. No. 4,635,356, issued on Jan. 13, 1987 to Masayuki Ohuchi et al. for Method of Manufacturing A Circuit Module discloses a method for potting discrete resistors, capacitors and transistor devices into a multi-layered module configuration. The supporting module structure for the potted devices is the cured potting resin itself. Although the described technique provides some measure of increased discrete device density, the materials used and the resulting structure are not aimed at solving the aforementioned problem of high density, high speed transistor memory chip packaging and its impact on high speed machine cycle time.

SUMMARY OF THE INVENTION

One object of the present invention is to provide a high density, high speed memory package characterized by minimal signal delay from memory chip to memory card structure.

Another object is to provide a memory card structure containing internally a three dimensional configuration of memory chips.

A further object is to provide a memory card structure having an internal three dimensional array of memory chips and characterized by maximum density, compatible thermal coefficients of expansion and ample heat dissipation.

In accordance with the present invention, dynamic random access memory (DRAM) chips or static RAM (SRAM) chips are placed directly within a multi-level memory card structure structure to eliminate the use of any intervening modules. The chips are positioned inside the card structure prior to the lamination of the signal and power layers to the card structure structure. To maintain thermal expansion stability between the chips and laminated card structure materials, a preferred embodiment of the present invention employs a glass-filled fluoropolymer-based material, commonly termed polytetra-fluoroethylene or PTFE. PTFE advantageously possesses a compliant nature, a thermal coefficient of expansion (TCE) approximately one half that of prior art epoxy glass dielectrics, a characteristic impedance about one third that of epoxy glass and a low dielectric constant, causing only a low signal propagation delay. The direct attachment of the memory chips within the card structure structure provides high operational speed and substantially increased chip density at the card structure level. Provision also is made for signal and power distribution between chips along vertical as well as horizontal planes internal to the card structure and for the cooling of the card structure. Memory control logic chips may be placed on the surface of the card structure.

DESCRIPTION OF THE PREFERRED EMBODIMENTS

Figure 1G:
FIGS. 1A-1N are a series of simplified cross-sectional views of the chip core portion of a memory card structure constructed in accordance with the present invention, as it would appear at successive times during fabrication.
Figure 1H:
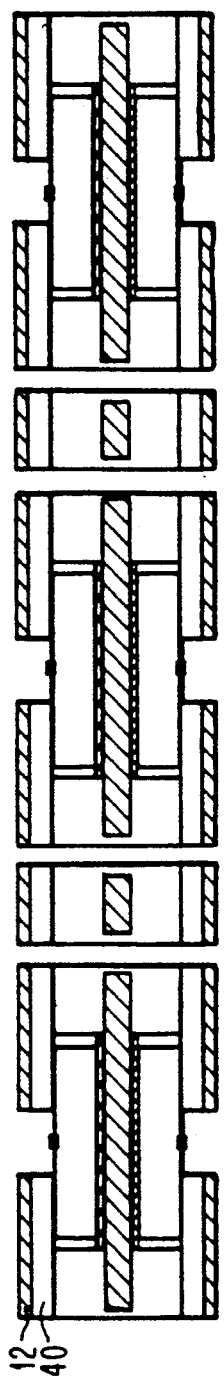
Figure 1I:
Figure 1J:
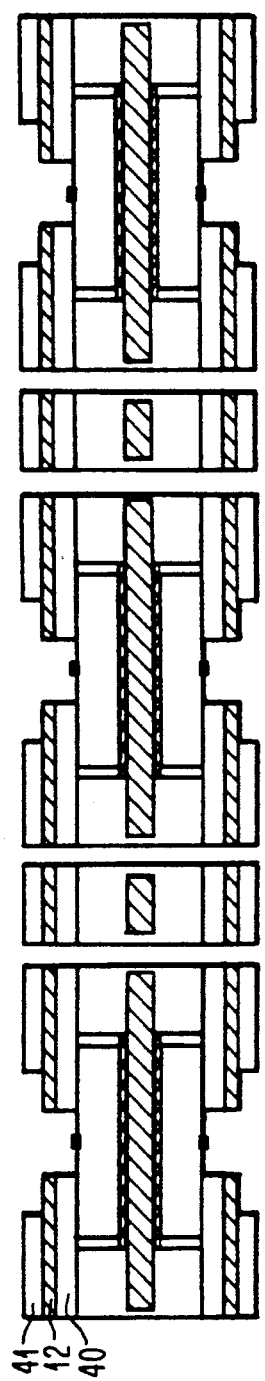
Figure 1N:
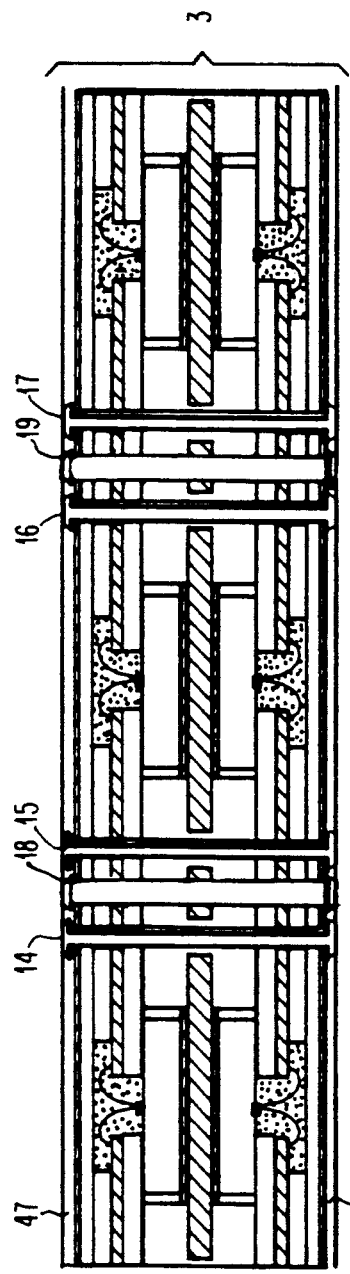
Figure 2:
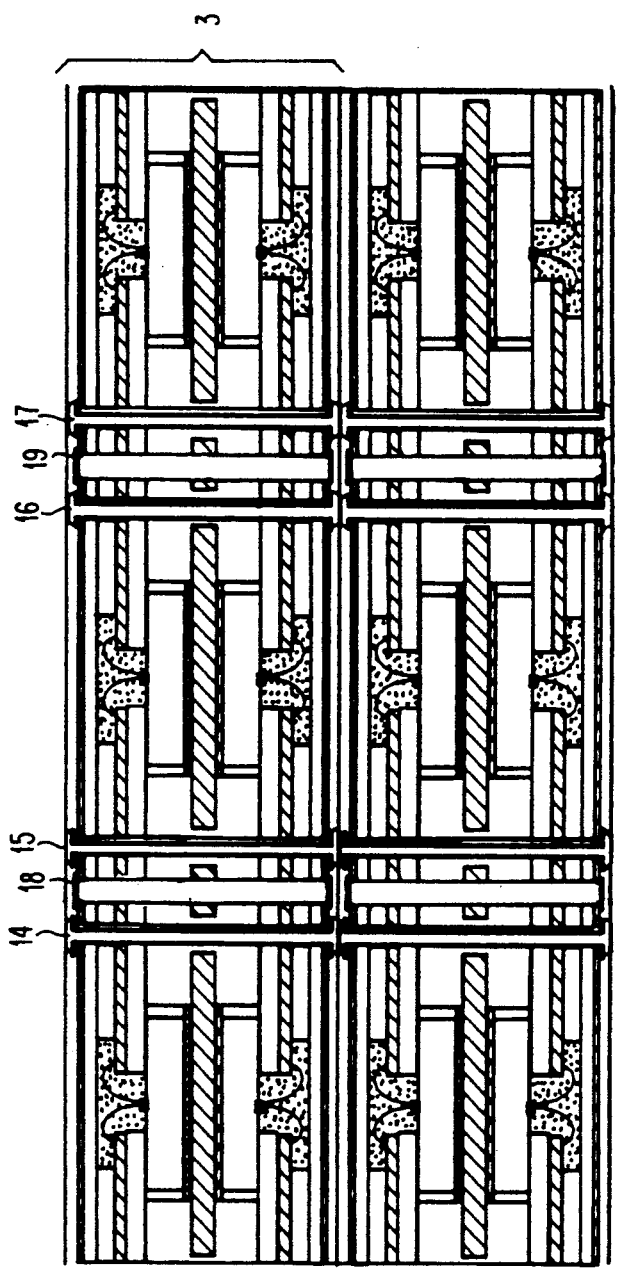
FIG. 2 is a cross-sectional view of two completed chip core portions joined together.
Figure 3:
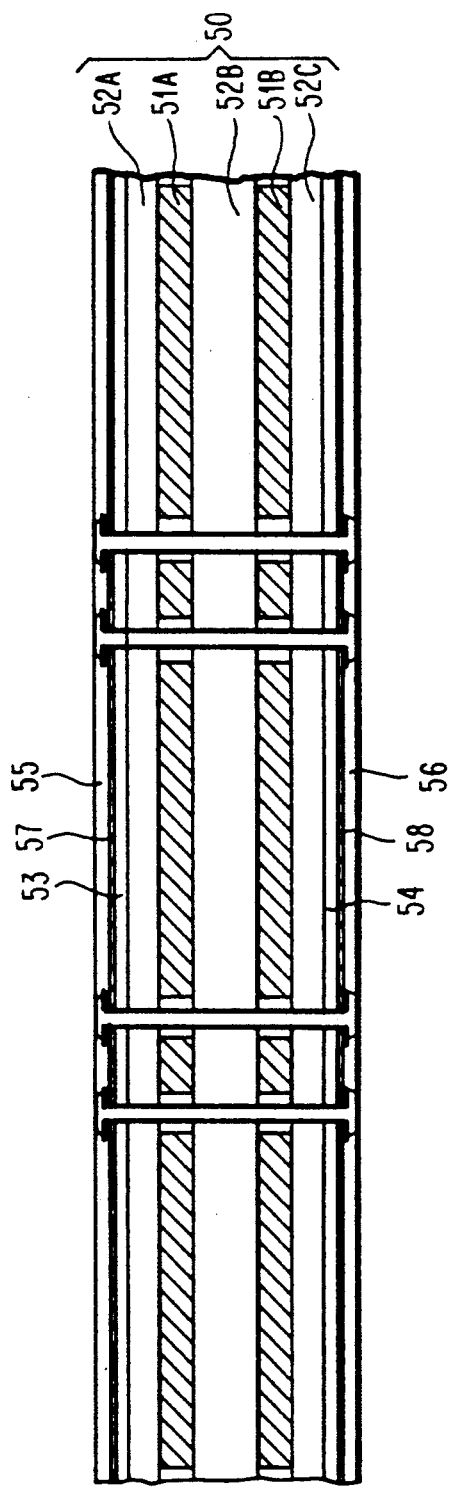
FIG. 3 is a cross-sectional view of the power core portion of the memory card structure of the present invention.
Figure 4:
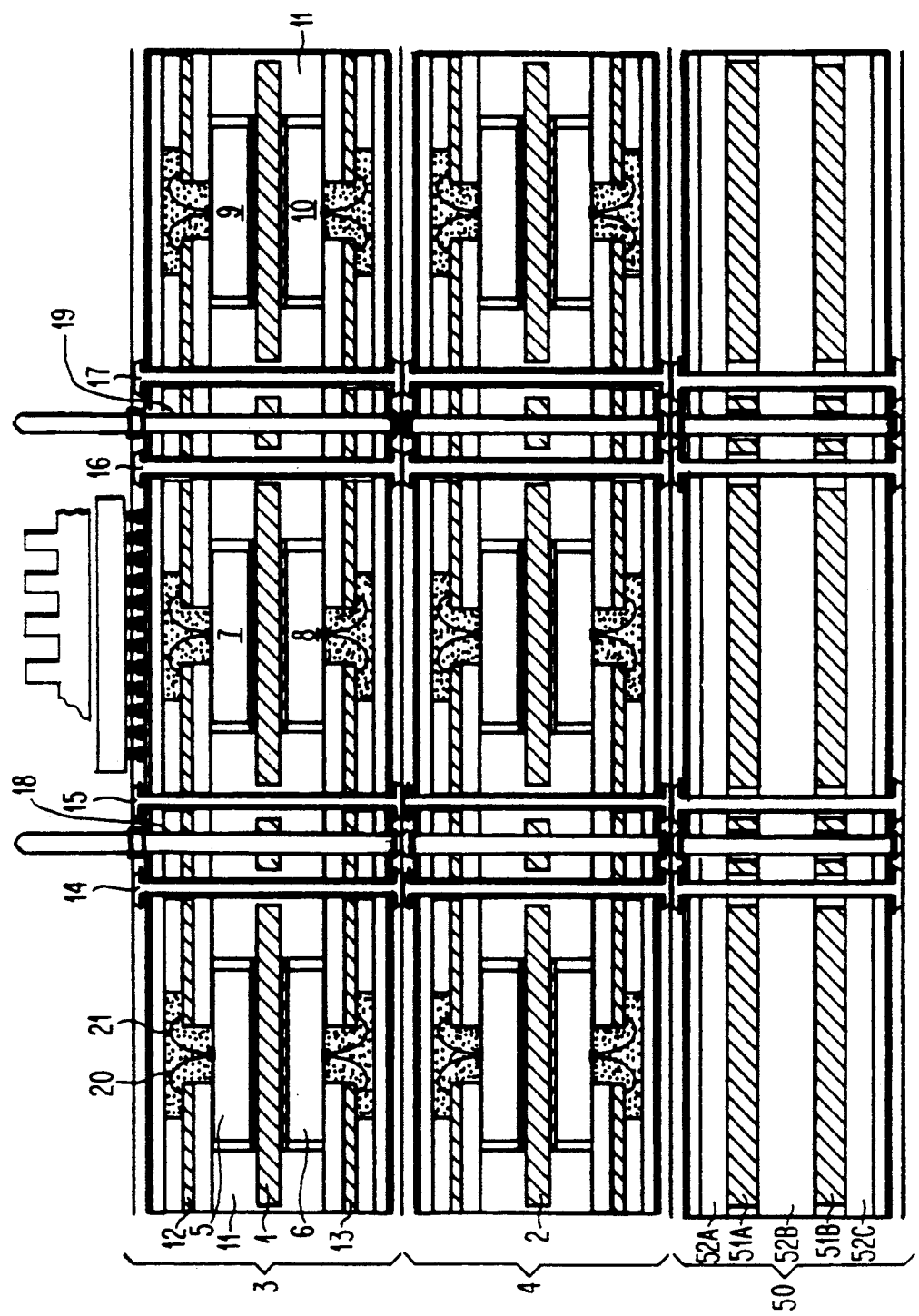
FIG. 4 is a cross-sectional view of one total memory card structure embodiment of the present invention including the chip core portions and power core portions of FIGS. 2 and 3, respectively.
Figure 5:
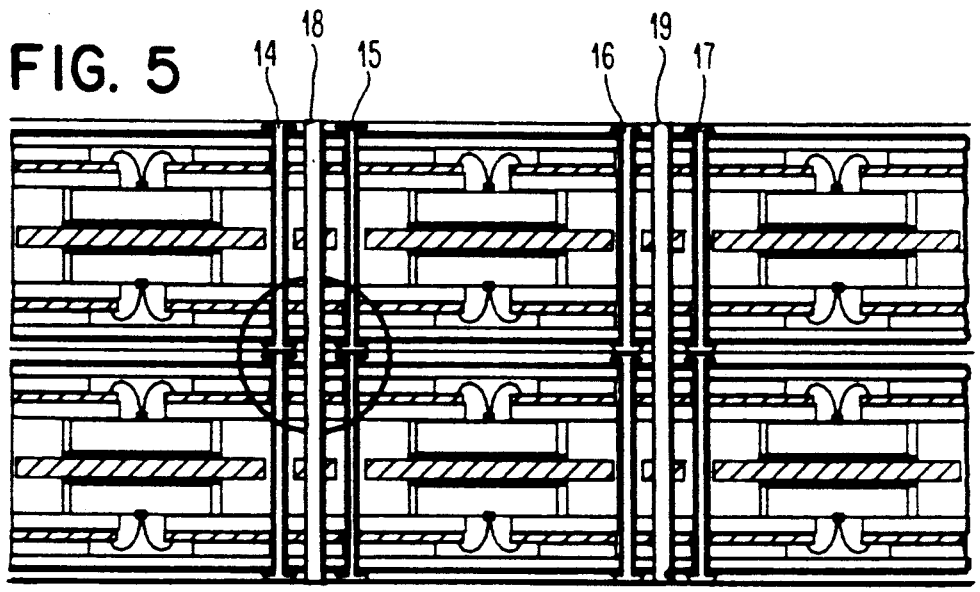
FIG. 5 is a partially exploded cross-sectional view of an alternative scheme for joining the chip core portions of FIG. 2.

Referring briefly to FIG. 4, a completed memory card structure, constructed in accordance with the present invention, will first be outlined before considering the detailed steps associated with FIGS. 1-3 by which the completed card structure is fabricated. Said card structure basically includes thermal conductor planes 2 in respective chip cores 3 and 4, memory chips (such as chips 5-10, inclusive, of core 3) in each of chip cores 3 and 4, dielectric layers (such as layers 11 of core 3) in each of chip cores 3 and 4, lead frames (such as lead frames 12 and 13 of core 3) in each of chip cores 3 and 4, together with plated-through-vias (such as vias 14, 15, 16 and 17 of core 3) and cooling vias 18 and 19.

Electrical contact is established with the embedded chips using appropriate plated vias and connected lead frame portions which are wire bonded (such as by wires 20 and 21 of core 3) to chip pads. The thermal conductor planes (such as plane 1 of core 3) make contact with cooling vias 18 and 19 to remove heat generated within the memory chips. Each of the dielectric layers 11 preferably comprises polytetrafluoroethylene (PTFE) material in order to exploit the attributes thereof including its compliant nature, low TCE, low characteristic impedance and low dielectric constant which translate into the desirable memory card structure characteristics of thermal expansion stability and reduced signal propagation delay.

The memory card structure of FIG. 4 further comprises power core portion 50 which employs the same material (preferably a copper-invarcopper alloy) for power busses 51 as is used in the chip cores 3 and 4 for the thermal conductor planes 1 and 2. The power busses are insulated by the same PTFE material 52 as is used for the dielectric layers such as layer 11 of core 3. Thus, the same benefit of thermal expansion stability is realized for power core 50 as for chip cores 3 and 4 due to the use of the same materials. Vias 14-17 and cooling vias 18 and 19 also penetrate power core 50.

Referring now to FIG. 1A, the steps for fabricating chip cores 3 and 4 will be described. For the sake of clarity, the same reference numerals of FIG. 4 will be used for the corresponding items of FIG. 1. Each chip core contains a thermal conductor plane (preferably copper-invar-copper) such as plane 1. Plane 1 also serves as a major structural support member for the core and is apertured at locations 23-26 of FIG. 2B to provide for vias 14-17 of FIG. 4. Dielectric material 11, preferably PTFE because of its compliant nature and the other desirable properties discussed previously, is applied to both sides of the apertured conductor plane 1 as shown in FIG. 2C.

Chip wells 28-33 of FIG. 1D are formed by chemical or mechanical means in dielectric material 11 to provide sites for the placement of chips 5-10 of FIG. 4. Double-sided thermally conductive dielectric tape segments 34-37 of FIG. 1E are positioned in wells 28-33 to secure memory chips 5-10 as shown in FIG. 1F.

The punched copper lead frame 12 of FIG. 1G is mounted on drilled PTFE carrier sheet 40 and is laminated over the chip core structure of FIG. 1H. Frame 12 contains fan-out circuitry for accessing memory chip circuit nodes. A drilled dielectric sheet 41 of FIG. 1I serves as a dam for an encapsulating material. The dam 41 material is laminated to both sides of the structure of FIG. 1H as illustrated in FIG. 1J. Wire bonds such as 20 and 21 of FIG. 1K join chip nodes to respective lead frame conductors and are encapsulated with an epoxy fill 42 of FIG. 1L on both sides of the chip core. When all of the wire bond wells are encapsulated front and back circuit wiring planes 43 and 44 of FIG. 1M are added over respective insulating layers 45 and 46 and are laminated to the structure.

The chip core is completed by circuit personalization metallization, i.e., holes (not shown) are formed in insulating layers 41 and 45 to permit the connection of lead frame 12 to the wiring plane 43 as desired (on both sides of the chip core); vias 14-17 are plated as shown in FIG. 1N to provide electrical continuity between the wiring planes of the chip core; holes are drilled and filled with, for example, solder, copper or other metal to form cooling vias 18 and 19 which contact the thermal conductor planes 1 and 2; and a protective coating 47 is applied to both surfaces of the chip core. In the embodiment of FIG. 4, it will be noted that solid cooling vias are provided but for higher power dissipation applications, the plated holes may be replaced by hollow holes adapted for water cooling. Appropriate heat exchanges (not shown) are connected to the ends of the cooling vias.

The chip core 3 is joined to one or more chip cores as in FIG. 2 by thermal-compression bonding, conductive polymers or other means using the pads at the ends of the plated vias 14-17 and at the ends of the cooling vias 18, 19. The power core of FIG. 3, comprising laminated electrically conductive layers 51A and 51B, dielectric layers 52A-C and 53-56 and circuit wiring planes 57 and 58, also is joined as in FIG. 4 to the chip cores to complete the memory card structure. Preferably, layers 52A, 52B and 52C comprise PTFE and layers 51A and 51B comprise copper-invar-copper. Logic drivers and interfacing circuits to and from the system can be directly mounted on either or both major surfaces of the card structure.

Figure 6:
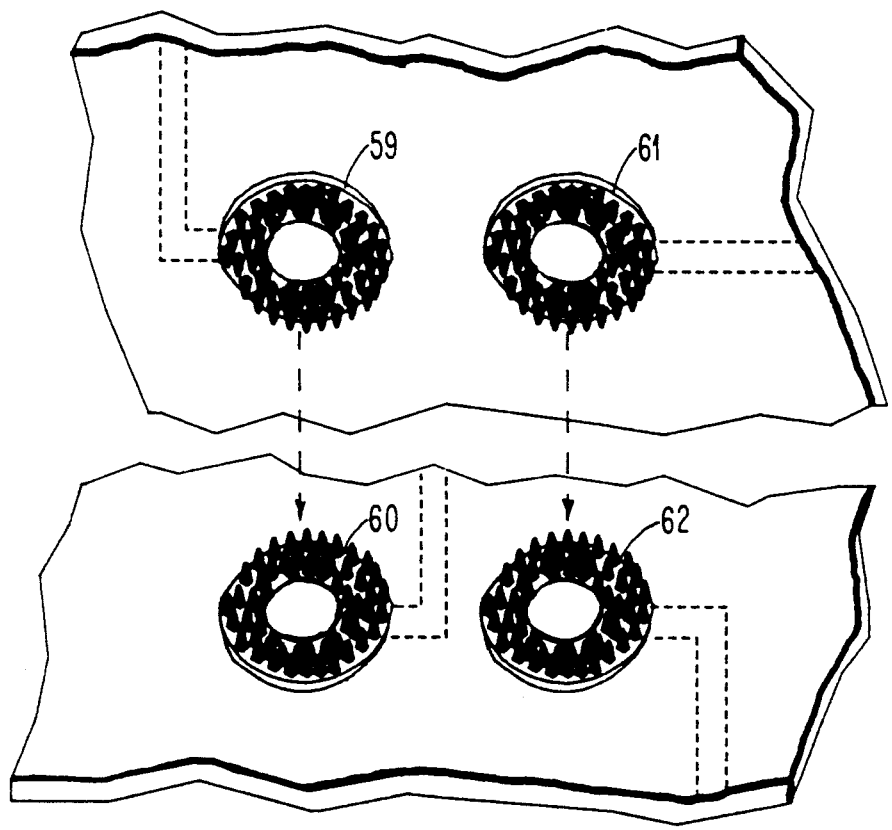
FIG. 6 is a perspective view of an alternative construction for the power planes of FIG. 1D.

Instead of permanently joining the cores to each other by thermal-compression bonding or the like in the described manner, the detachable joint of FIG. 6 may be substituted to permit rework or replacement of chip cores containing unacceptable numbers of defective chips. Mechanical pressure joints consisting of mating pads 59 and 60 and pads 61 and 62 are placed on respective facing ends of vias 14-17 and cooling vias 18 and 19. The pads mesh together under applied pressure to form a solid electrical or thermal contact.

Figure 7:
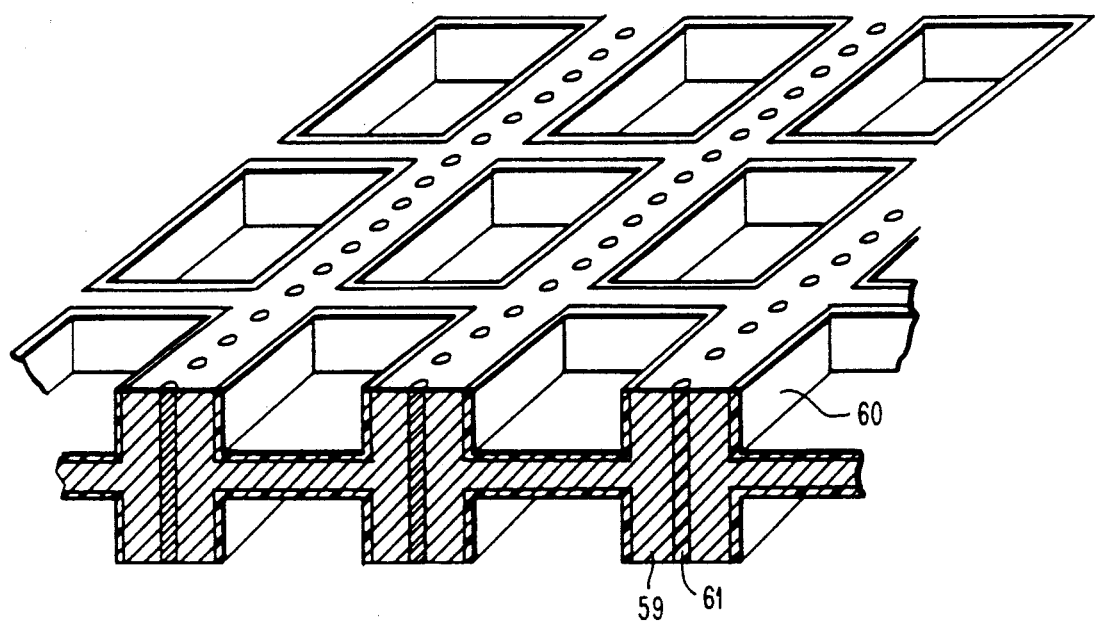
FIG. 7 is a view of an alternative construction that may be substituted for the structure of FIG. 1D.

FIG. 7 shows a preformed molybdenum thermal conductor 59, lined with PTFE 60 along the interior vertical surfaces, that may be substituted for the structure of FIG. 1D in the fabrication process of FIGS. 1E-1N. The walls of conductor 59 surround and protect the memory chips (to be placed therein) from any inadvertent damage during the thermal compression bonding steps of the memory card structure fabrication process. Additionally, the use of molybdenum enhances the thermal conduction capacity of conductor 59 relative to that of the copper-invarcopper conductor 1 previously described. The holes 61 in conductor 59 require insulating linings so that they can be plated and used as signal or power vias.

It should be noted that additional chip cores may be mounted on either side of power core 20 of FIG. 4, depending upon thermal requirements and the allowable total card structure thickness in a given memory design situation.

Figure 8:
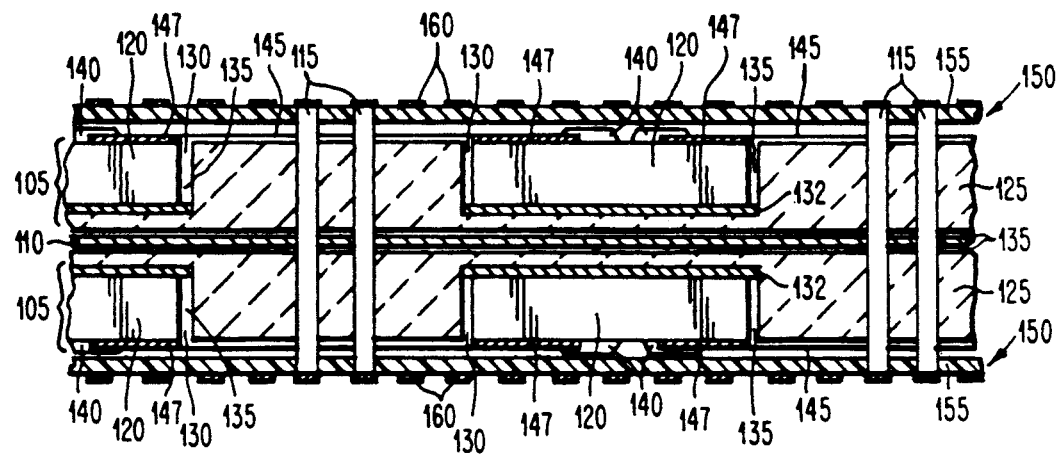
FIG. 8 is a cross-sectional view of an alternative embodiment of a card structure in accordance with the present invention.
Figure 9:
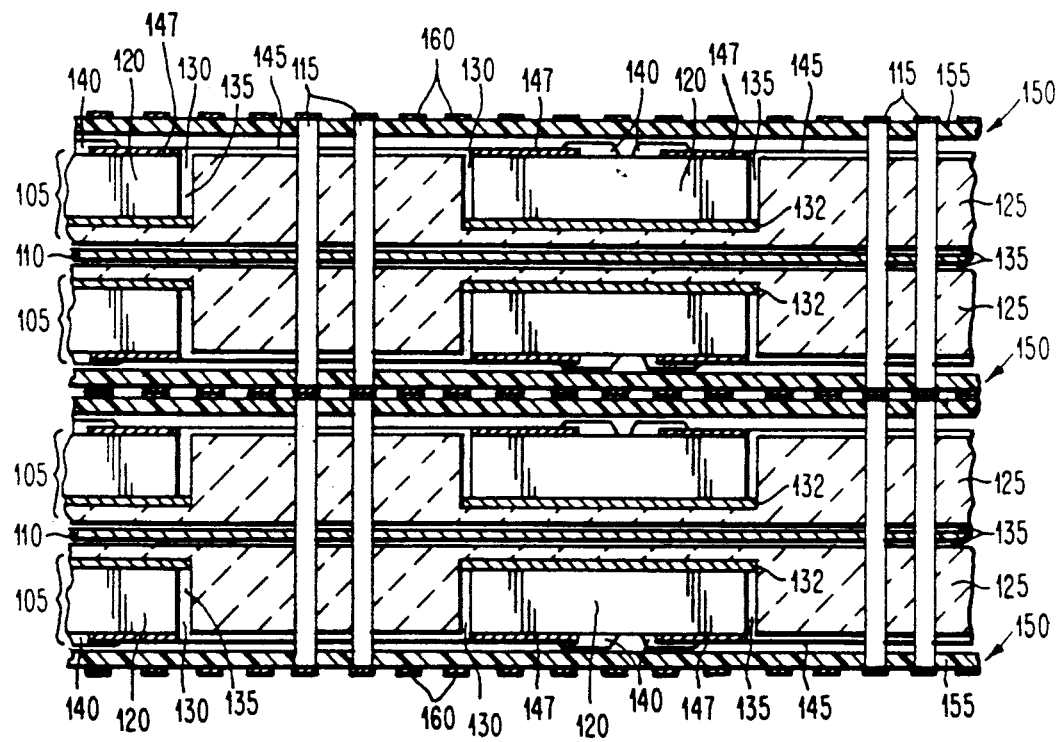
FIG. 9 is a cross-sectional view of two of the card structures of FIG. 8 joined together.

Another embodiment of the present invention is illustrated in FIGS. 8 and 9. Advantageously, the illustrated card structure 100 may be ultrathin, on the order of 50-100 mil or less, so that it is particularly suitable for, but not limited to, present day IC memory cards. Such memory cards are commonly used as removable data-storage medium for portable computers. Referring to FIG. 8, the card structure 100 includes two chip cores 105. Each chip core 105 is joined or laminated onto opposite major surfaces of a power core 110. The power core ,110 may be electrically connected to selective vias 115 and may be further electrically connected to a power source (not shown). The power core 110, through the selective vias 115, provide power and/or ground to the semiconductor chips 120. Furthermore, the power core 110 allows for improved cross-coupling between semiconductor chips 120, thus improving stability and performance. An appropriate thermally stable material, such as pure copper, copper-invar-copper, molybdenum, or the like may be used to form the power core 105.

Each chip core 105 includes a compensator core 125 having a plurality of chip wells 130 which are arranged, for example, in the form of a two dimensional array. Stacking or having adjacent layers of compensator cores 125, which each have chip wells 130 arranged in the form of a two dimensional array, will form a card structure 100 having chip wells 130 arranged in the form of a three dimensional array. Further, the corresponding semiconductor chips 120 implanted into the chip wells 130 will also be arranged in the card structure 100 in the form of a three dimensional array.

Each chip well 130 is of suitable size so as to allow one of the semiconductor chips 120 to be fitted or implanted therein. Preferably, the size of each chip well 130 is such that the semiconductor chip 120 implanted therein is substantially imbedded in the compensator core 125. In other words, it is preferable for each semiconductor chip 120 to fit into its corresponding chip well 130 such that minimal thickness or no thickness is added to the compensator core 125; and the thickness of the entire card structure 100 is preferably only slightly greater than the total thickness of the chips 120 implanted therein.

The compensator cores 125 provide thermal stability to the card structure 100 and also provide thermal compensation during operation of the semiconductor chips 120, i.e., heat generated during operation of the chips 120 is dissipated through the compensator cores 125 and out of the card structure 100. Accordingly, the material chosen to form the compensator cores 125 should be a thermal conductor with suitable thermal conductivity and suitable thermal coefficients of expansion. For example, copper-invar-copper, molybdenum, or the like can be used for the compensator cores 125.

Each semiconductor chip 120 has a plurality of wires 140 which are bonded to the chip 120 and further bonded to lead frame conductors 145. The portions of the lead frame conductors 145 which extend over the semiconductor chip 120 are separated from, but adhered to the semiconductor chip 120 by a layer 147. By way of example, the wires 140 may comprise gold, the lead frame conductors 145 may comprise a copper alloy, and the layer 147 may comprise a polyimide film, such as the polyimide film sold by the DuPont De Nemours Company under the tradename of Kapton. Preferably, the wires 140 should be as short as possible for improving the electrical characteristics of the card structure 100, and for minimizing or eliminating lead inductance. A suitable wire bonding scheme is disclosed in copending U.S. application Ser. No. 694,719 filed May 2, 1991, allowed Oct. 1, 1991 (U.S. Pat. No. 5,086,018 to be issued Feb. 4, 1992) and copending divisional U.S. application Ser. No. 805,214 filed Dec. 11, 1991, both of which are assigned to the assignee of the present invention, and both of which are incorporated herein by reference.

The lead frame conductors 145 are connected to the vias 115, such as by conventional braising or solder reflow joining techniques during the via plating stages, and allow for output of signals from the semiconductor chips 120 to other devices or wiring layers as may be required. Further, the semiconductor chips 120, which may be memory chips, are preferably burned-in and/or pretested by various testing techniques before being implanted into the chip wells 130. "Burning-in" is a term of art which generally refers to a controlled preliminary operation of a semiconductor chip in order to determine if its electrical characteristics meet required specifications. Advantageously, the wire bonding scheme disclosed in the above-referenced U.S. Patent Applications allows for burning-in and/or pretesting of the semiconductor chips 120 before implantation into the chip wells 130. Furthermore, this wire bonding scheme also allows for substantially thin packaging of the semiconductor chips 120.

Before implanting the semiconductor chips 120 into the chip wells 130, a compliant dielectric layer 135 is applied by conventional lamination means to the major surfaces of the compensator core 125 and to the sidewalls of the chip wells 130. However, it is important to note that since heat generated by the semiconductor chips 120 must dissipate through the compensator core 125, the dielectric layer 135 is not applied to the bottoms of the chip wells 130. Rather, means, such as thermal tape 132 comprising polyimide having a low dielectric constant, should be provided for securing the semiconductor chips 120 in the chip wells 130 and for allowing the heat generated by the semiconductor chips 120 to reach the compensator core 125.

In addition to insulating the compensator core 125 from the chips 120, the power core 110 and the lead frames 145, the dielectric layer 135 functions to thermally stabilize the semiconductor chips 120 and any adjacent wiring layers, such as wiring layer 150. Advantageously, polytetrafluoroethylene (PTFE) or teflon has been found to be a suitable material for forming the dielectric layer 135.

Additionally, at least one wiring layer 150 is laminated over each chip core 105. Each wiring layer 150 includes an insulating layer 155 and the necessary interconnections or wiring traces 155 for electrically connecting, by way of selective vias 115, the chips 120 to other devices and/or other wiring layers as may be necessary. In one embodiment, the insulating layer 155 comprises PTFE. Advantageously, since lamination involves increased temperature and pressure, the layer 147 and the lead frame conductors 145 serve to cushion and protect the semiconductor chip 120 in the chip well 130 during laminating of the wiring layer 150 over the chip core 105.

The selective vias 115 can be utilized for signal input to or signal output from the chips 120. Each selective via 115 extends through the power core 110, compensator cores 125 and wiring layers 150. The selective vias 115 are each plated by conventional plating techniques. Such plating allows for the selective vias 115 to electrically contact the power core 110 and wiring traces 155, as may be required for operation of the card structure. Further, the compensator cores 125 are electrically isolated from the selective vias 115, such as by using a clearance via.

FIG. 9 illustrates that the card structures 100 of the present invention can be stacked for forming cards, such as memory cards, having greater chip density and thus increased memory capabilities. Although stacking of only two card structures 100 is shown, it should be understood that any number of card structures 100 can be stacked as may be desired or required for a particular application. When stacking card structures 100, the wiring layers 150 between card structure layers are joined, such as by conventional compression bonding, solder reflow, conductive polymers, or the like, and should be appropriately insulated from one another so as to prevent undesired short circuits. Further, the vias 115 of the stacked card structures 100 can be connected by conventional techniques, such as by solder reflow techniques.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. A card structure having an internal three dimensional array of implanted semiconductor chips, said card structure comprising:
    a power core having two surfaces which oppose one another; and
    a plurality of chip cores, each chip core being joined to said power core, such that each of said two opposing surfaces of said power core have at least one chip core joined thereto, each chip core including:
    a compensator core having a two dimensional array of chip wells, each chip well allowing for a respective one of said semiconductor chips to be implanted therein, and
    a compliant dielectric material on the major surfaces of said compensator core except at the bottoms of said chip wells, said compliant dielectric material having a low dielectric constant and having a thermal coefficient of expansion compatible with those of said semiconductor chips and said compensator core, whereby thermal expansion stability with said chips and said compensator core is maintained.

2. A card structure according to claim 1, wherein each said semiconductor chip is a memory chip.

3. A card structure according to claim 1, wherein each said semiconductor chip is pre-tested before being implanted into said card structure.

4. A card structure according to claim 1, wherein said compliant dielectric material comprises polytetrafluoroethylene.

5. A card structure according to claim 1, further comprising means for securing said semiconductor chips in said chip wells.

6. A card structure according to claim 5, wherein said means for securing comprises a thermal tape.

7. A card structure according to claim 6, wherein said thermal tape comprises a polyimide having a low dielectric constant.

8. A card structure according to claim 1, further comprising connecting means in electrical communication with said semiconductor chips for connecting said semiconductor chips to other devices.

9. A card structure according to claim 8, wherein said connecting means comprises a wiring layer joined to said chip core.

10. A card structure according to claim 1, further comprising a plurality of vias extending through said power core and said chip cores, said vias being electrically connected to said power core and being electrically isolated from said compensator cores of said chip cores.

* * * * *